United States Patent [19]
Sato et al.

[11] Patent Number: 6,114,685
[45] Date of Patent: Sep. 5, 2000

[54] SOLID-STATE RADIATION DETECTOR HAVING A CHARGE TRANSFER DEVICE

[75] Inventors: Keiji Sato; Yutaka Saitoh, both of Chiba, Japan

[73] Assignee: Seiko Instruments R&D Center Inc., Japan

[21] Appl. No.: 09/012,168

[22] Filed: Jan. 22, 1998

[30] Foreign Application Priority Data

Jan. 23, 1997  [JP]  Japan ..................... 9-010685

[51] Int. Cl.⁷ .................... H01J 40/14; H01L 27/148
[52] U.S. Cl. .................... 250/214 R; 250/214.1; 257/215; 257/233
[58] Field of Search ................ 250/214 R, 208.1, 250/214.1; 257/214, 215, 226, 227, 233, 431; 348/298, 303, 311, 320, 322; 358/482, 483

[56] References Cited

U.S. PATENT DOCUMENTS 4,876,585  10/1989  Ozawa ..................... 250/208.1
5,514,887  5/1996  Hokari ..................... 257/233

*Primary Examiner*—Edward P. Westin
*Assistant Examiner*—Kevin Pyo
*Attorney, Agent, or Firm*—Adams & Wilks

[57] ABSTRACT

A solid-state radiation detecting device comprises an insulation layer having a pair of opposed surfaces. First and second single crystal silicon semiconductors are disposed on respective ones of the opposed surfaces of the insulating layer. A photoelectric conversion element is disposed on the first single crystal silicon semiconductor. A signal processing circuit having a charge transfer device is disposed on the second single crystal silicon semiconductor.

12 Claims, 6 Drawing Sheets

Prior Art

SOLID-STATE RADIATION DETECTOR HAVING A CHARGE TRANSFER DEVICE

BACKGROUND OF THE INVENTION

1. Field of the Invention

The present invention relates to a solid-state radiation detecting device that uses a CCD (charge coupled device) or a BBD (bucket brigade device) and is suitable for detecting a two-dimensional image of high-energy radiation such as X rays, rays, or charge particles.

2. Description of the Related Art

In the fields of astronomy and medical treatment, it is necessary to two-dimensionally detect, i.e., obtain a two-dimensional image of, X rays or the like by converting those into an electrical signal. For this purpose, a solid-state detecting device that is strong and capable of miniaturization is desired.

To this end, as described in detail in, for instance, the Journal of The Physical Society of Japan, Vol. 48, No. 4, pp. 264–270, 1993, it has been attempted to use a high-resistivity substrate and make the depletion layer thicker in a solid-state imaging device using a CCD that was developed as a solid-state imaging device for visible light. With this method, quantum efficiency of about 50% has been obtained at 10 keV.

Another approach is known in which a scintillator layer for converting x rays or the like into visible light is provided on the surface of a solid-state imaging device.

For example, a solid-state radiation detecting device using a CTD (charge transfer device) that is used for the above purpose is configured as shown in FIG. 2, which shows the basic configuration of an interline CTD. Charge that is generated by a 1-pixel photoelectric conversion element 13 is moved to a vertical transfer CTD 21 via a transfer gate 23 and then moved to a horizontal CTD 22. An output signal is obtained from an output gate 24.

As shown in the sectional view of FIG. 9, a 1-pixel structure includes, in addition to the photoelectric conversion element 13, a CTD 14 that is a vertical transfer CCD in this case. In this example, the photoelectric conversion element 13 is a photodiode and the vertical transfer CCD is a buried-channel CCD (BCCD).

In the above solid-state radiation detecting device, the detection efficiency of high-energy radiation is low because the depletion layer cannot be made sufficiently long. Further, radiation damage easily occurs because the MOS structure such as a CCD is used at many locations in signal processing circuits mainly for a scanning function. In addition, since the photoelectric conversion elements and the signal processing circuits are formed on the same surface, the effective area of the detecting section is limited.

In the case of using a scintillator, the resolution is sacrificed and the detection efficiency of low-energy radiation is low. Further, it is difficult to form an optically superior scintillator layer on a solid-state imaging device.

SUMMARY OF THE INVENTION

An object of the present invention is therefore to realize a solid-state radiation detecting device in which the detection efficiency of high-energy radiation is improved without reduction in resolution, and in which radiation damage does not easily occur, by providing single crystal silicon semiconductors on both surface of an SOI substrate of a bonded structure and forming photoelectric conversion elements and signal processing circuits for transfer/readout, storage, amplification, etc. of a signal on the two single crystal silicon semiconductors in a separated manner.

The invention provides a solid-state radiation detecting device in which an SOI substrate of a bonded structure is used and single crystal silicon semiconductors are provided on both surfaces of the SOI substrate, and photoelectric conversion elements and signal processing circuits for transfer/readout, storage, amplification, etc. of a signal are formed on the two single crystal silicon semiconductors in a separated manner.

With the above structure, the detection area can be increased. Radiation damage can be reduced by causing radiation to be input from the side of the single crystal silicon semiconductor on which the photoelectric conversion elements are formed.

It becomes possible to elongate the depletion layer by using a high-resistivity substrate of a single crystal silicon semiconductor produced by the FZ (floating zone method) as the single crystal silicon semiconductor on which the photoelectric conversion elements are formed.

Although each photoelectric conversion element may be formed by using a photodiode, a pin photodiode, an APD (avalanche photodiode), or a phototransistor, the pin photodiode is superior for the purpose of elongating the depletion layer.

By implementing the signal transfer/readout function by using a CTD (charge transfer device) that is a CCD (charge coupled device) or a BBD (bucket brigade device), the circuit configuration can be simplified.

The BBD can be formed by a MOSFET, a junction FET, a bipolar transistor, or the like. In particular, a BBD with less radiation damage and high transfer efficiency can be obtained by using a junction FET.

DETAILED DESCRIPTION OF THE PREFERRED EMBODIMENTS

Several embodiments of the invention will be hereinafter described with reference to the accompanying drawings.

Embodiment 1

Figure 1:
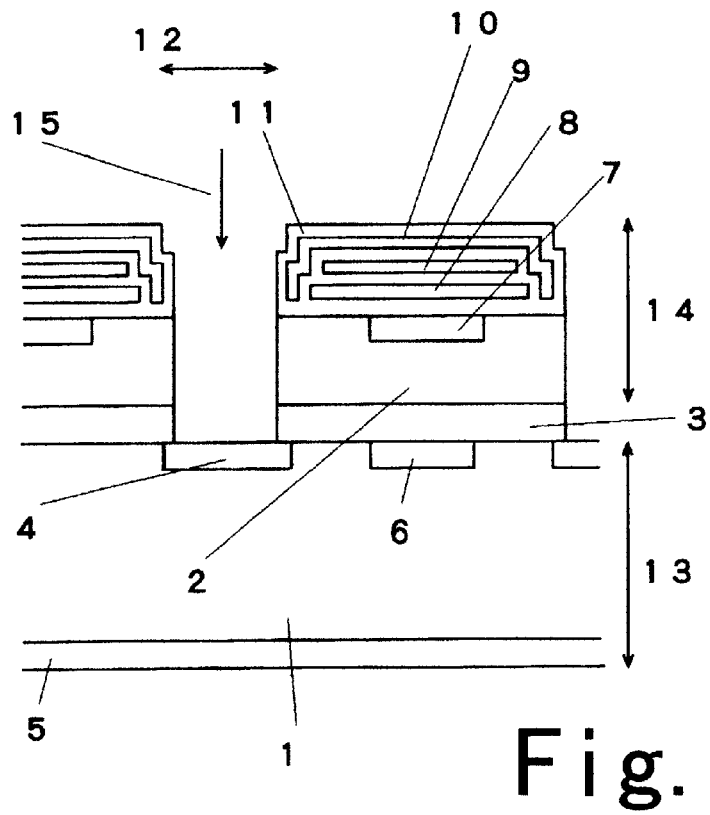
FIG. 1 is a sectional view of a radiation detecting device according to a first embodiment of the invention.

FIG. 1 is a sectional view of a radiation detecting device according to a first embodiment of the invention. P⁻ single crystal silicon semiconductors 1 and 2 are provided with an insulating layer 3 interposed in between, and an SOI substrate is thus used. More specifically, the insulating layer 3 has a pair of opposed surfaces, and the p⁻ single crystal silicon semiconductors 1 and 2 are provided on respective ones of the opposed surfaces of the insulating layer 3. A photoelectric conversion element 13 that is a pin photodiode is provided by forming an n region 4 and a p⁺ region 5 in the p⁻ single crystal silicon semiconductor 1. A p⁺ region 6 is a channel stopper for the pin photodiode.

A CTD 14 is formed on the p⁻ single crystal silicon semiconductor 2. The CTD 14 is a buried-channel CCD having an n region 7. A two-layer electrode structure is formed which includes polysilicon electrodes 8 and 9. A radiation shield 10 and an SiO₂ layer 11 for interlayer insulation and other purposes are also formed.

The p⁻ single crystal silicon semiconductor 2 having the CTD 14 is formed with an opening 12. Incident radiations 15 come from the p single crystal silicon semiconductor 2 side, go through the opening 12, and enter the photoelectric conversion element 13 formed in the p⁻ single crystal silicon semiconductor 1.

The photoelectric conversion element 13 may be a photodiode, a phototransistor, an APD, or a MOS capacitor, instead of the pin photodiode.

The CTD 14 may be a CCD or a BBD. The BBD may be constituted of a MOSFET, a junction FET, or a bipolar transistor.

Although the p⁻ single crystal silicon semiconductor is used in this embodiment, the invention can be practiced in the same manner even with an n⁻ single crystal silicon semiconductor. Although the following description is directed to cases of using only a p⁻ or n⁻ single crystal silicon semiconductor, it goes without saying that the invention can be practiced with both p⁻ and n⁻ single crystal silicon semiconductors.

Figure 2:
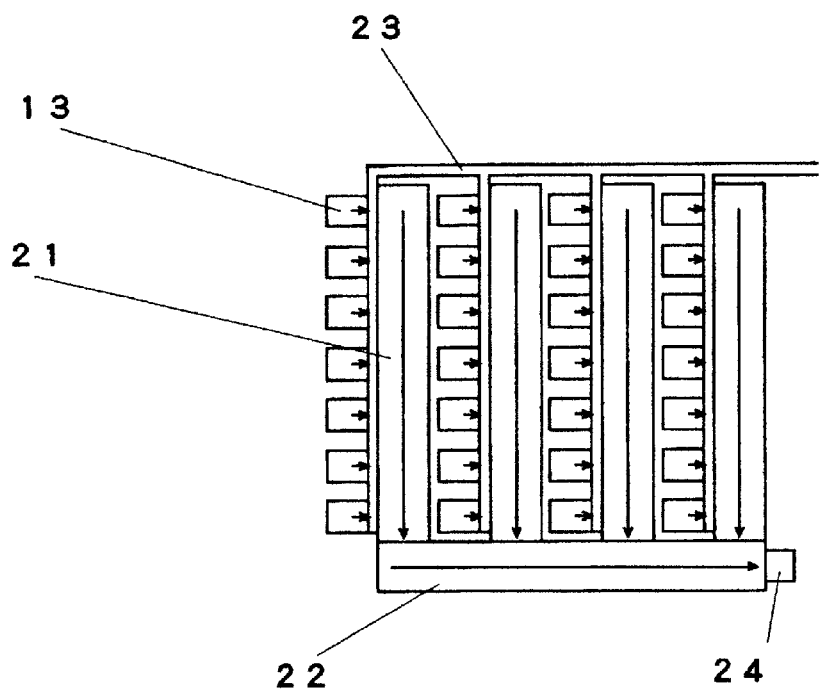
FIG. 2 shows the entire configuration of the radiation detecting device of FIG. 1.

FIG. 2 shows the entire configuration of the radiation detecting device of FIG. 1, which is an interline radiation detecting device including vertical transfer CTDs 21 and a horizontal transfer CTD 22. FIG. 1 is a sectional view taken along the horizontal direction in FIG. 2.

Charge that is generated in each photoelectric conversion element 13 is transferred to the associated vertical transfer CTD 21 via the transfer gate 23, then transferred to the horizontal CTD 22, and finally output from an output gate 24.

In the above radiation incidence scheme in which radiations 15 are input from the side of the p⁻ single crystal silicon semiconductor 2 having the CTD 14, the radiation receiving surfaces of the photoelectric conversion elements 13, i.e., the openings 12, are provided on the same surface as the vertical transfer CTDs 21 and hence the areas of the radiation receiving surfaces are restricted by the vertical transfer CTDs 21.

The constituent circuits and elements are only the photoelectric elements 13, the vertical transfer CTDs 21, the horizontal transfer CTD 22, the transfer gate 23, and the output gate 24. For example, it is possible to impart an amplifying function to each photoelectric conversion element 13 by connecting a transistor thereto.

Embodiment 2

Figure 3:
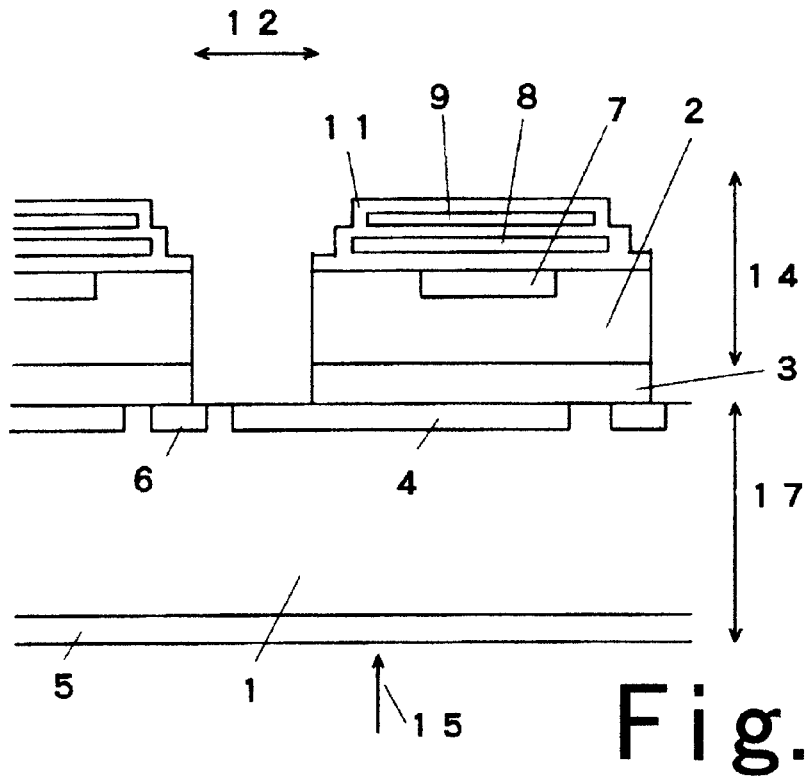
FIG. 3 is a sectional view of a radiation detecting device according to a second embodiment of the invention.

FIG. 3 is a sectional view of a radiation detecting device according to a second embodiment of the invention. P⁻ single crystal silicon semiconductors 1 and 2 are provided with an insulating layer 3 interposed in between, and an SOI substrate is thus used. A pin photodiode 17 (photoelectric conversion element) is provided by forming an n region 4 and a p⁺ region 5 in the p⁻ single crystal silicon semiconductor 1. A p⁺ region 6 is a channel stopper for the pin photodiode 17.

A CTD 14 is formed on the p⁻ single crystal silicon semiconductor 2. The CTD 14 is a buried-channel CCD having an n region 7. A two-layer electrode structure is formed which includes polysilicon electrodes 8 and 9.

By virtue of the use of the pin photodiode 17, the depletion layer can be extended in the depth direction and it becomes possible to allow incident radiations 15 to come from the p⁻ single crystal silicon semiconductor 1 side.

Since the transfer circuit (vertical transfer CCDs 21) and the pin photodiodes 17 form a layered structure, they do not interfere with each other in terms of horizontal layout and hence the effective radiation receiving area of each photoelectric conversion element can be increased.

Further, this structure has an advantage that radiation damage hardly occurs in the CTDs 14 or other signal processing circuits formed on the p⁻ single crystal silicon semiconductor 2.

An opening 12 on the side of the p⁻ single crystal silicon semiconductor 2 is necessary only in an interconnection between the pin photodiode 17 and the CTD 14.

To elongate the depletion layer 17 with application of a low acceleration voltage, it is preferred to use a high resistivity substrate manufactured by the FZ (floating zone) method. The FZ method can easily produce high resistivity single crystal silicon of more than 1 k cm, and hence a depletion layer of hundreds of micrometers can be obtained easily at tens of volts.

Figure 4:
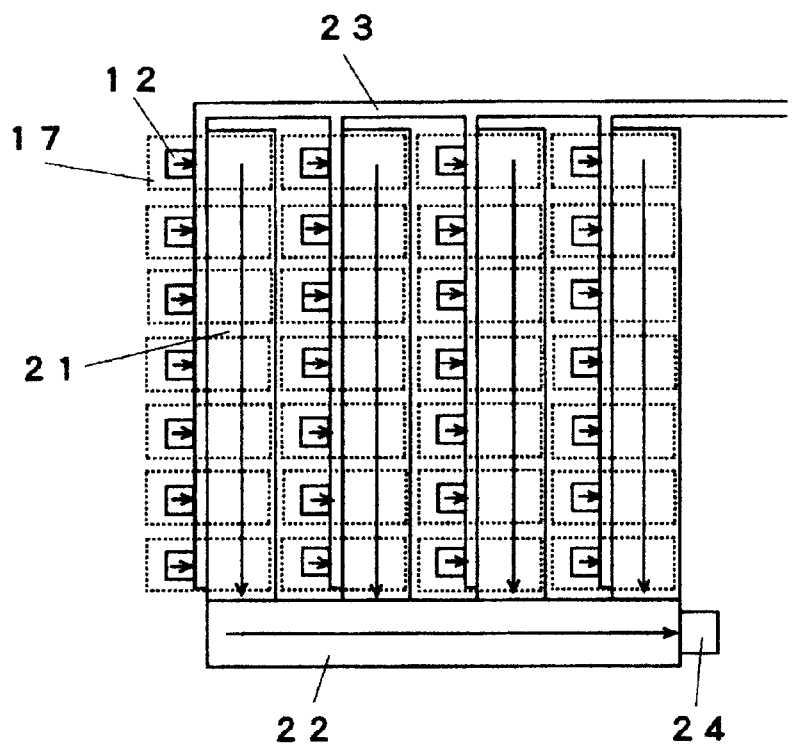
FIG. 4 shows the entire configuration of the radiation detecting device of FIG. 3.

FIG. 4 shows the entire configuration of the radiation detecting device of according to a second embodiment of the invention, which is an interline radiation detecting device including vertical transfer CTDs 21 and a horizontal transfer CTD 22.

Charge that is generated in each pin photodiode 17 is transferred to the associated vertical transfer CTD 21 via the transfer gate 23, then transferred to the horizontal CTD 22, and finally output from an output gate 24.

One-pixel pin photodiode 17 is indicated by a dotted line. In this embodiment, since the region where the pin photodiodes 17 and the transfer circuit has a layered structure, the area of the 1-pixel pin photodiode 17, i.e., the effective radiation detecting region, can be increased without being restricted by the transfer circuit etc., as shown in FIG. 4.

Further, this embodiment has an advantage that the p⁻ single crystal silicon semiconductor 1 in which the pin photodiode 17 is formed serves as a radiation shield for various circuits formed on the p⁻ single crystal silicon semiconductor 2.

Embodiment 3

Figure 5:
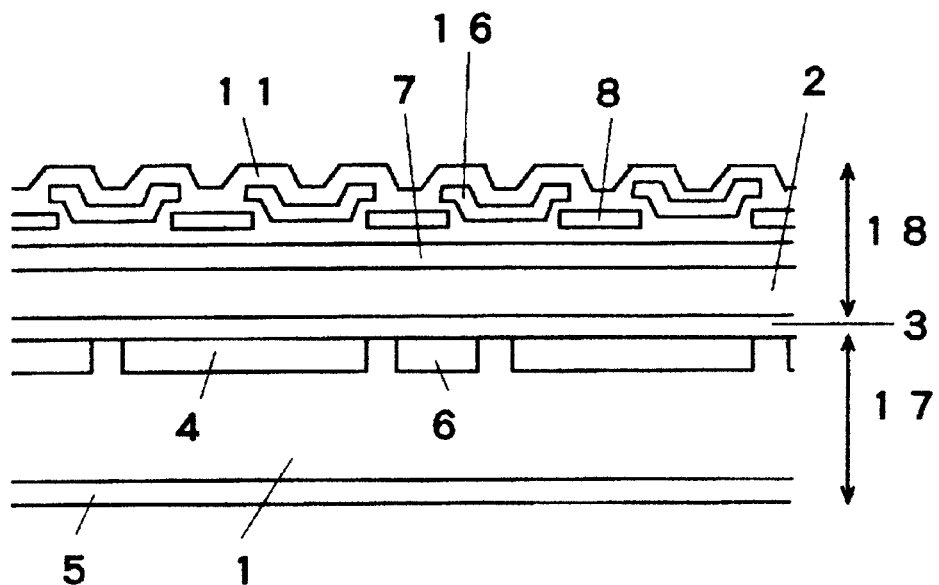
FIG. 5 is a sectional view of a radiation detecting device according to a third embodiment of the invention.

FIG. 5 is a sectional view of a radiation detecting device according to a third embodiment of the invention. FIG. 3 corresponds to a figure taken along the vertical transfer CTD 21 in FIG. 4. Sectional views taken in this direction will be used in the following embodiments because they enable easy recognition of features and hence are easy to understand.

As shown in FIG. 5, a buried-channel CCD is used as a CTD. That is, p⁻ single crystal silicon semiconductors 1 and 2 are provided with an insulating layer 3 interposed in between. A pin photodiode 17 is provided by forming an n region 4 and a p⁺ region 5 in the p⁻ single crystal silicon semiconductor 1. A p⁺ region 6 is a channel stopper for the pin photodiode 17.

A vertical transfer CCD 18 is formed on the p⁻ single crystal silicon semiconductor 2. The vertical transfer CCD 18 is a buried-channel CCD having an n region 7. A two-layer electrode structure is formed which includes a polysilicon electrode 8 and an aluminum electrode 16.

Embodiment 4

Figure 6:
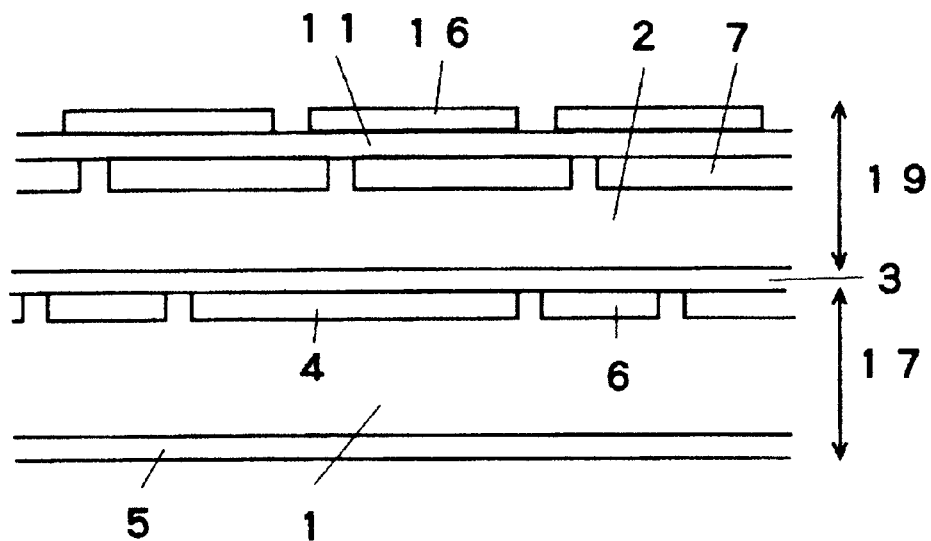
FIG. 6 is a sectional view of a radiation detecting device according to a fourth embodiment of the invention.

FIG. 6 is a sectional view of a radiation detecting device according to a fourth embodiment of the invention. P⁻ single crystal silicon semiconductors 1 and 2 are provided with an insulating layer 3 interposed in between. A pin photodiode 17 is provided by forming an n region 4 and a p⁺ region 5 in the p⁻ single crystal silicon semiconductor 1. A p⁺ region 6 is a channel stopper for the pin photodiode 17.

A vertical transfer MOS BBD 19 having n regions 7 as the source and the drain and an aluminum electrode 16 is formed on the p⁻ single crystal silicon semiconductor 2.

Embodiment 5

Figure 7:
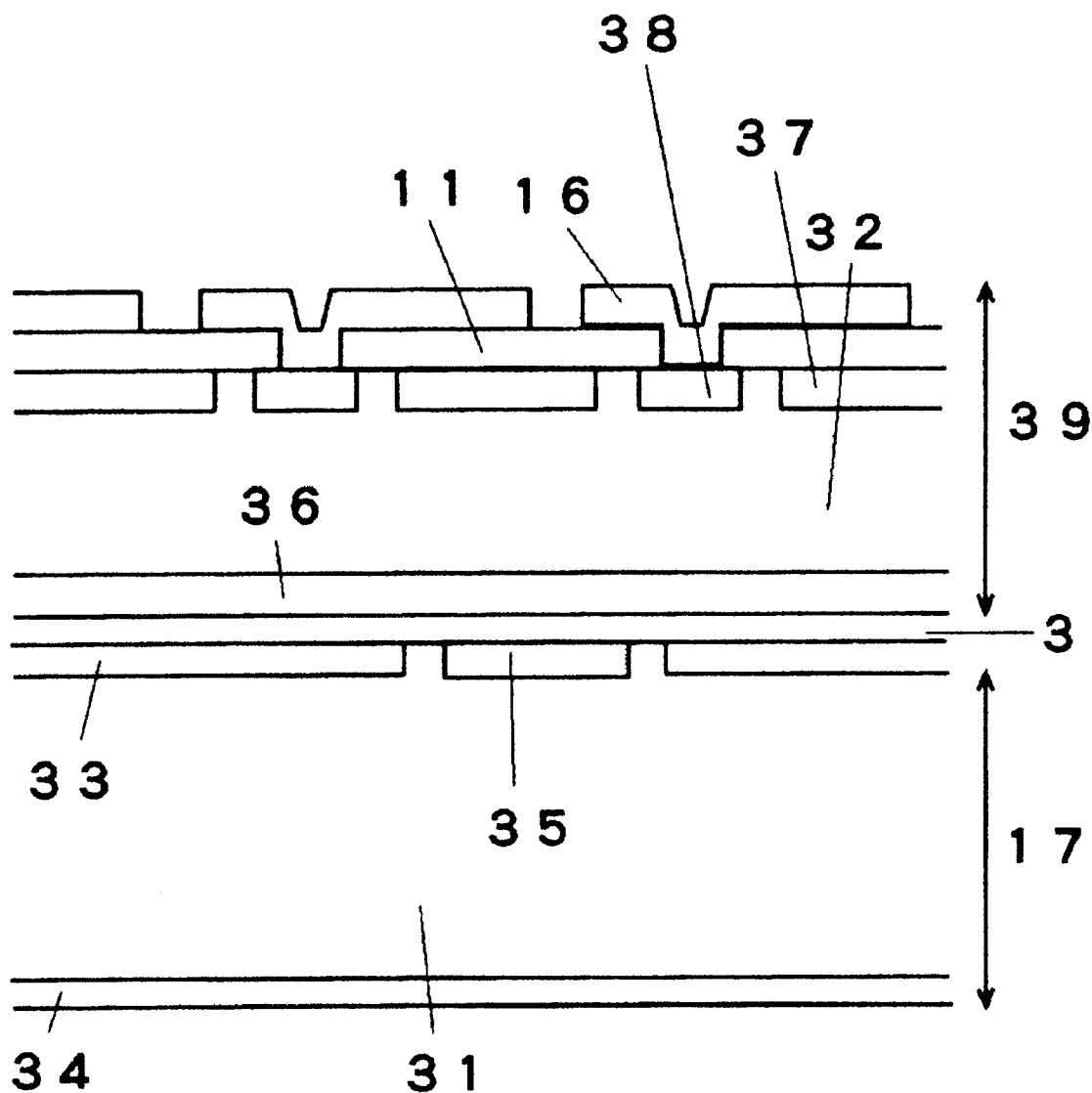
FIG. 7 is a sectional view of a radiation detecting device according to a fifth embodiment of the invention.

FIG. 7 is a sectional view of a radiation detecting device according to a fifth embodiment of the invention. N⁻ single crystal silicon semiconductors 31 and 32 are provided with an insulating layer 3 interposed in between. A pin photodiode 17 is provided by forming a p⁺ region 33 and an n⁺ region 34 in the n⁻ single crystal silicon semiconductor 31. An n⁺ region 35 is a channel stopper for the pin photodiode 17.

A vertical transfer junction FET BBD 39 having n⁺ regions 37 as the source and the drain, a p⁺ region 38 as the gate, and an aluminum electrode 16 is formed on the n⁻ single crystal silicon semiconductor 32.

The junction FET BBD 39 is hardly affected by radiation damage of $SiO_2$, which is advantageous to use in a radiation detecting device.

Figure 8A:
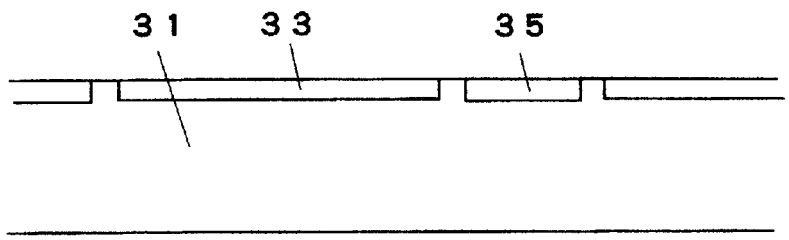
FIGS. 8A–8C showing a manufacturing method of a radiation detecting device according to the invention.
Figure 8B:
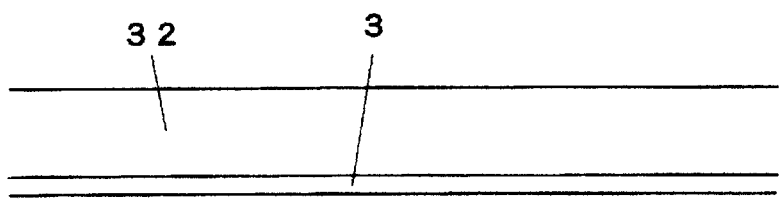
Figure 8C:
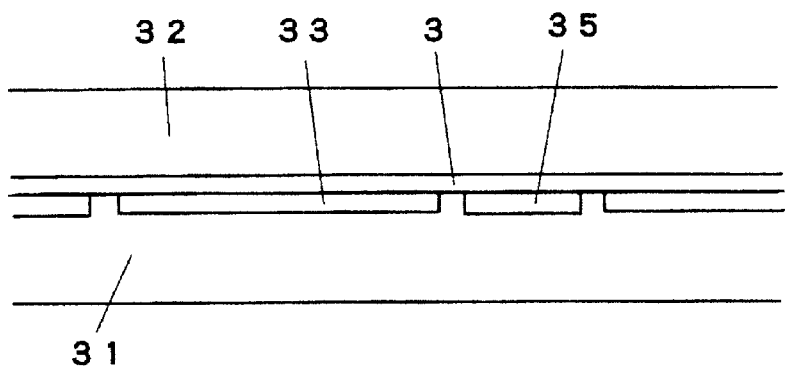
Figure 9:
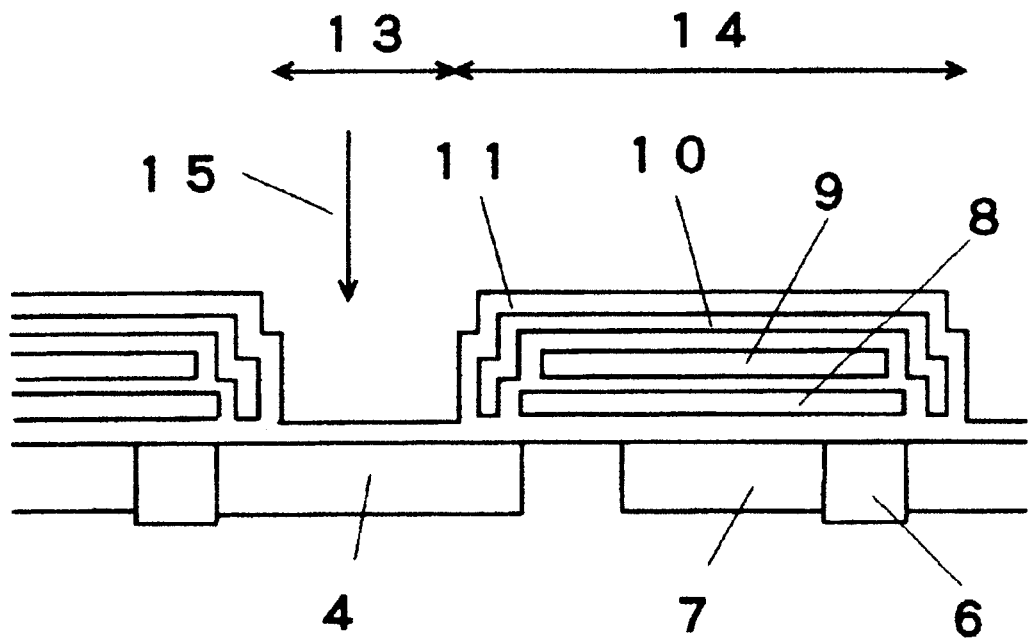
FIG. 9 is a sectional view of a conventional solid-state imaging device.

FIGS. 8A–8C shows a manufacturing process of a radiation detecting device according to the invention, particularly a manufacturing process of a bonded SOI substrate that is important in practicing the invention.

As shown in FIG. 8A, first a p⁺ region 33 and an n⁺ region 35 are formed on a high-resistivity n⁻ single crystal silicon semiconductor 31 produced by the FZ method.

On the other hand, as shown in FIG. 8B, an insulating layer 3 is formed on an n⁻ single crystal silicon semiconductor 32 on which a CCD, BBD, or the like is to be formed.

The insulating layer 3 is usually a $SiO_2$ layer. A bonded structure SOI substrate having single crystal silicon semiconductors on both sides is obtained by bonding together the n- single crystal silicon semiconductors 31 and 32 by thermocompression bonding via the $SiO_2$ layer.

The radiation detecting device of the invention shown in FIGS. 1, 3, 5, 6, or 7 will be obtained by polishing one or both surfaces of the thus-formed SOI substrate when necessary and then executing necessary steps.

Although the above manufacturing process is directed to the case of using n⁻ single crystal silicon semiconductors, naturally a radiation detecting device using p⁻ single crystal silicon semiconductors can be manufactured by a similar process.

As described above, according to the invention, a two-dimensional solid-state radiation detecting device having a depletion layer that is elongated in the depth direction and high detection efficiency of high-energy radiations can be realized by forming photoelectric conversion elements on one of two single crystal silicon semiconductors provided on both surfaces of a bonded structure SOI substrate, forming signal processing circuits as typified by a transfer circuit on the other single crystal silicon semiconductor, using a high-resistivity substrate produced by the FZ method as the single crystal silicon semiconductor on which the photoelectric conversion elements are formed, and using pin photodiodes as the photoelectric conversion elements.

The transfer circuit can be formed by using a CCD or BBD, in which case the structure is simplified and the transfer efficiency is made high.

The section in which the photoelectric conversion elements are formed and the section in which the signal processing circuits are formed are separated from each other by employing a layered structure, whereby the effective detection area of each photoelectric conversion element can be increased.

Radiation damage in the signal processing circuits can be reduced by causing radiation to be input from the side of the single crystal silicon semiconductor on which pin photodiodes are formed where depletion layers are fully developed.

Radiation damage can also be reduced by using a junction FET as the BBD.

What is claimed is:

1. A solid-state radiation detecting device comprising: an insulation layer having a pair of opposed surfaces; first and second single crystal silicon semiconductors disposed on respective ones of the opposed surfaces of the insulating layer; a photoelectric conversion element disposed on the first single crystal silicon semiconductor; and a signal processing circuit having a charge transfer device disposed on the second single crystal silicon semiconductor.

2. A solid-state radiation detecting device according to claim 1; wherein the charge transfer device comprises a charge coupled device.

3. A solid-state radiation detecting device according to claim 1; wherein the charge transfer device comprises a bucket brigade device.

4. A solid-state radiation detecting device according to claim 3; wherein the bucket brigade device comprises a junction FET.

5. A solid-state radiation detecting device according to claim 1; wherein the photoelectric conversion element comprises a pin photodiode.

6. A solid-state radiation detecting device according to claim 1; wherein the first single crystal silicon semiconductor is fabricated using a floating zone method.

7. A solid-state radiation detecting device comprising: an insulating layer having a pair of opposed surfaces; first and second single crystal silicon semiconductors disposed on respective ones of the opposed surfaces of the insulating layer; a photoelectric conversion element disposed on the first single crystal silicon semiconductor; and a signal processing circuit having a charge transfer device disposed on the second single crystal silicon semiconductor; wherein incident radiation is input into the solistate radiation detecting device from the side of the first single crystal silicon semiconductor.

8. A solid-state radiation detecting device comprising: an insulation layer having a first surface and a second surface; a first single crystal silicon semiconductor disposed on the first surface of the insulation layer; a photoelectric conversion element disposed on the first single crystal silicon semiconductor; a second single crystal silicon semiconductor disposed on the second surface of the insulation layer; and a charge transfer device disposed on the second single crystal silicon semiconductor and having a two-layer electrode structure.

9. A solid-state radiation detecting device according to claim 8; wherein the two-layer electrode structure of the charge transfer device comprises two polysilicon electrodes.

10. A solid-state radiation detecting device according to claim 9; wherein the charge transfer device comprises a buried-channel charge coupled device.

11. A solid-state radiation detecting device according to claim 8; wherein the charge transfer device comprises a buried-channel charge coupled device.

12. A solid-state radiation detecting device according to claim 8; wherein the photoelectric conversion element comprises a pin photodiode.

* * * * *